United States Patent

Takahashi

[11] Patent Number: 5,478,008
[45] Date of Patent: Dec. 26, 1995

[54] METHOD OF SOLDERING AN ELECTRIC CABLE TO A CIRCUIT BOARD

[75] Inventor: Hiroji Takahashi, Tokyo, Japan

[73] Assignee: NEC Corporation, Tokyo, Japan

[21] Appl. No.: 324,613

[22] Filed: Oct. 18, 1994

[30] Foreign Application Priority Data

Oct. 28, 1993 [JP] Japan ................................ 5-270831

[51] Int. Cl.$^6$ ................................ H01L 21/603
[52] U.S. Cl. ........................ 228/214; 228/179.1
[58] Field of Search ................ 228/179.1, 214, 228/222, 106, 5.5, 44.7; 29/868, 869

[56] References Cited

U.S. PATENT DOCUMENTS

| | | | |
|---|---|---|---|
| 4,708,885 | 11/1987 | Saito et al. ............................ | 228/214 |
| 4,804,805 | 2/1989 | Antonas et al. ........................ | 228/214 |
| 4,817,856 | 4/1989 | Koistinen et al. ..................... | 228/214 |
| 5,316,204 | 5/1994 | Takehashi et al. .................... | 228/179.1 |

FOREIGN PATENT DOCUMENTS 60-95869  5/1985  Japan .

Primary Examiner—Samuel M. Heinrich
Attorney, Agent, or Firm—Foley & Lardner

[57] ABSTRACT

An electric cable is soldered to an electronic circuit board by sticking the heat-resistive adhesive tape on the end portion of the insulating ocating and the end portion of the core conductor of the cable, and melting solder by contacting the heater tip on the heat-resistive adhesive tape. Therefore, the coating of the electric cable is prevented from being peeled off when heated and the heater tip is free from solder dregs.

7 Claims, 2 Drawing Sheets

METHOD OF SOLDERING AN ELECTRIC CABLE TO A CIRCUIT BOARD

BACKGROUND OF THE INVENTION

1. Field of the Invention

The present invention relates to a method of soldering an electric cable to an electronic circuit board directly and, particularly, to a soldering method with using a heater chip of a heated soldering device.

2. Description of the Prior Art

In a case where an electric cable such as flat cable is soldered to an electronic circuit board, it is usual to directly solder core conductors of the flat cable to a wiring pattern on the electronic circuit board. In such case, however, a portion of a coating of the electric cable in the vicinity of soldered portions is melted by soldering heat and the corresponding portion of the core conductors to the melted coating are exposed. As a result, mechanical strength of the core conductors in the vicinity of the connecting portions is degraded, leading breakage of the conductors.

In order to solve the problem of breakage of the conductors around the soldered portions, an electric cable protecting method is disclosed in Japanese Patent Application Laid-open No. Sho 60-95869 published on May 29, 1985, in which a hot-melt of a plastic material which becomes a molten state by heat and then solidified is fixed on a tip portion of an electric cable. The hot-melt is melted by heat given to the solder connecting portion of the electric cable, flows to a peripheral portion of core conductors of the cable to fill it and, then, is solidified. With such hot-melt, the core conductors around the connecting portion is reinforced and the conductor breakage is prevented.

In this method, however, there is a problem that a molten hot-melt flows onto a surface of the circuit board, so that the board surface is contaminated. Further, since it is impossible to control the flowing direction of the molten hot-melt, there may be another problem that hot-melt adheres to undesirable portions of the circuit board which are not to be covered by such hot-melt.

On the other hand, when an electric cable is to be soldered to a circuit board by utilizing a heater tip of a heated soldering device, there is a problem that solder dregs remain on the heater tip, leading to defective soldering. Therefore, the heater tip must be cleaned frequently.

SUMMARY OF THE INVENTION

An object of the present invention is to provide a soldering method for electric cable having insulating coating, which can prevent a portion of the insulating coating of the cable which is in the vicinity of a soldering portion from being melted by soldering heat to thereby prevent core conductors of the cable from being exposed.

Another object of the present invention is to provide a soldering method which can prevent solder dregs from adhering to a heater tip.

A further object of the present invention is to provide a soldering method with which there is no contamination of a surface of a circuit board even after an electric cable is soldered thereto.

The soldering method for electric cable according to the present invention comprises the step of contacting an exposed top portion of a core conductor of the electric cable, having a heat-resistive adhesive tape stuck on the exposed top portion of the core conductor and an end of an insulating coating of the electric cable, with a solder connecting point on a circuit board, and the step of soldering the core conductor to the solder connecting point by heating it while contacting a heater tip with the heat-resistive adhesive tape on the core conductor.

The core conductor of the electric cable is soldered to the solder connecting point by heating indirectly through the heat-resistive adhesive tape. A melting point of the heat-resistive adhesive tape is higher than melting point of solder as well as heating temperature of the heater tip. The heat-resistive adhesive tape is composed of a heat-resistive member and an adhesive attached on one surface of the heat-resistive member. The adhesive is adapted to adhere the heat-resistive member onto the top portion of the insulating coating and the core conductor of the electric cable and may be of a material which is not melted by soldering heat or a thermosetting material whose bonding ability is improved by melting. The solder is preliminarily provided on the solder connecting point as a solder bump.

In the present invention, since the end portion of the insulating coating of the electric cable and the exposed portion of the core conductor are stuck to each other by the heat-resistive adhesive tape while the heater tip contacts with the heat-resistive tape to heat the solder, the coating is prevented from being peeled off by heat conducted from the core conductor to the coating. Further, since the heater tip does directly contact not with solder but with the heat-resistive adhesive tape, solder dregs are not left on the heater tip, removing necessity of frequent cleaning thereof.

DETAILED DESCRIPTION OF THE PREFERRED EMBODIMENTS

Figure 1:
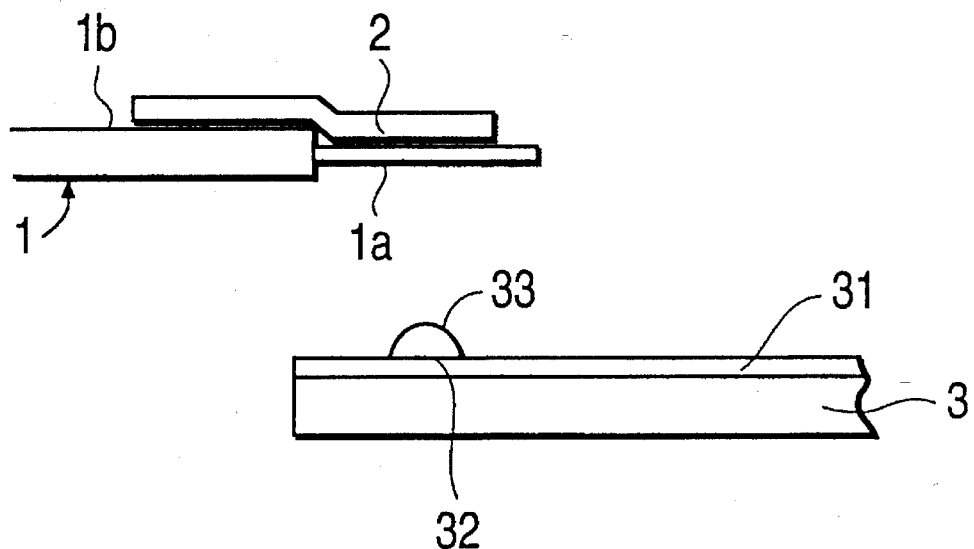
FIGS. 1 and 2 are front views of a solder connecting portion, respectively, for illustrating the soldering method according to a first embodiment of the present invention.

In FIG. 1, an electric cable 1 is composed of a core conductor 1a and an insulating coating 1b surrounding the core conductor 1a, and an end portion of the insulating coating 1b is removed to expose an end portion of the core conductor. A heat-resistive adhesive tape 2 is continuously stuck on an area from an edge of the insulating coating 1b to the core conductor 1a. An area of the core conductor 1a on which the heat-resistive adhesive tape 2 is stuck is a portion with which a heater tip contacts later. The heat-resistive adhesive tape 2 may be stuck immediately before a soldering operation or may be stuck preliminarily in a manufacturing step of the electric cable 1. A wiring pattern 31 of a conductor is formed on a surface of an electronic circuit board 3 and a solder connecting point 32 having a solder bump 33 thereon is formed on the wiring pattern. The end portion of the electric cable 1 is to be soldered to the solder connecting point 32.

The heat-resistive adhesive tape 2 is composed of a polyimide tape having thickness of 100 μm or less and, preferably, 2 to 20 μm, and an adhesive stuck on one surface of the polyimide tape for adhering the latter onto the end portion of the insulating coating 1b and the core conductor 1a. The adhesive is of a material which is not melted by soldering heat or a thermosetting material, such as Kapton tape commerically available from 3M, which has an adhesion force increased when melted by soldering heat. Temperature at which the heat-resistive adhesive tape 2 is deformed by heat is 360° C. or higher, which is higher than melting point, 183° C. of the solder as well as heating temperature, 260° C. of the soldering tip of a soldering device. The heat-resistive adhesive tape 2 can withstand heating at 260° C. for 10 seconds.

Figure 2:
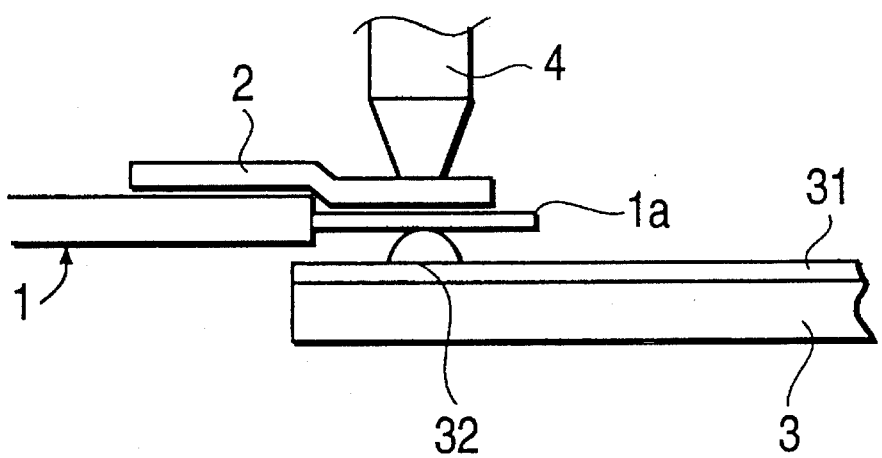

The soldering procedure of the electric cable 1 to the solder connecting point 32 is performed through the following steps: First, the electric cable 1 with the heat-resistive adhesive tape 2 stuck thereon is disposed on the connecting point 32 on the electronic circuit board 3, with the core conductor 1a thereof being aligned with the solder bump 33 on the connecting point 32. Then, as shown in FIG. 2, a heater tip 4 heated to 260° C. is made in contact with the heat-resistive adhesive tape 2 for five seconds to heat the core conductor 1a through the heat-resistive adhesive tape 2 to thereby melt the solder bump 33 on the connecting point 32. The soldering operation is completed by separating the heater tip 4 from the heat-resistive adhesive tape 2 thereafter.

Since the melting point of the heat-resistive adhesive tape 2 is higher than melting point of the solder and further higher than the heating temperature of the heater tip 4 by 100° C., the heat-resistive adhesive tape 4 is not melted when heated by the heater tip 4 for five seconds. However, if the heater tip 4 is kept in contact with the heat-resistive adhesive tape 4 for so long time, the latter may be deformed by heat accumulation. Therefore, precaution therefor is required.

In this embodiment, since the end portion of the coating 1b is fixed with respect to the core conductor 1a by the heat-resistive adhesive tape 2 while the heater tip 4 contacts with the heat-resistive adhesive tape 4 to heat the latter, the coating 1b is prevented from peeling off from the core conductor 1a due to heat conducted thereto from the core conductor 1a. Further, since the heater tip 4 does not directly contact with the solder but does contact with the heat-resistive adhesive tape 2, the heater tip 4 can be kept clean against solder dregs. In addition, the heat-resistive adhesive tape 2 does not influence other wiring patterns on the electronic circuit board and does not contaminate the latter.

Figure 3:
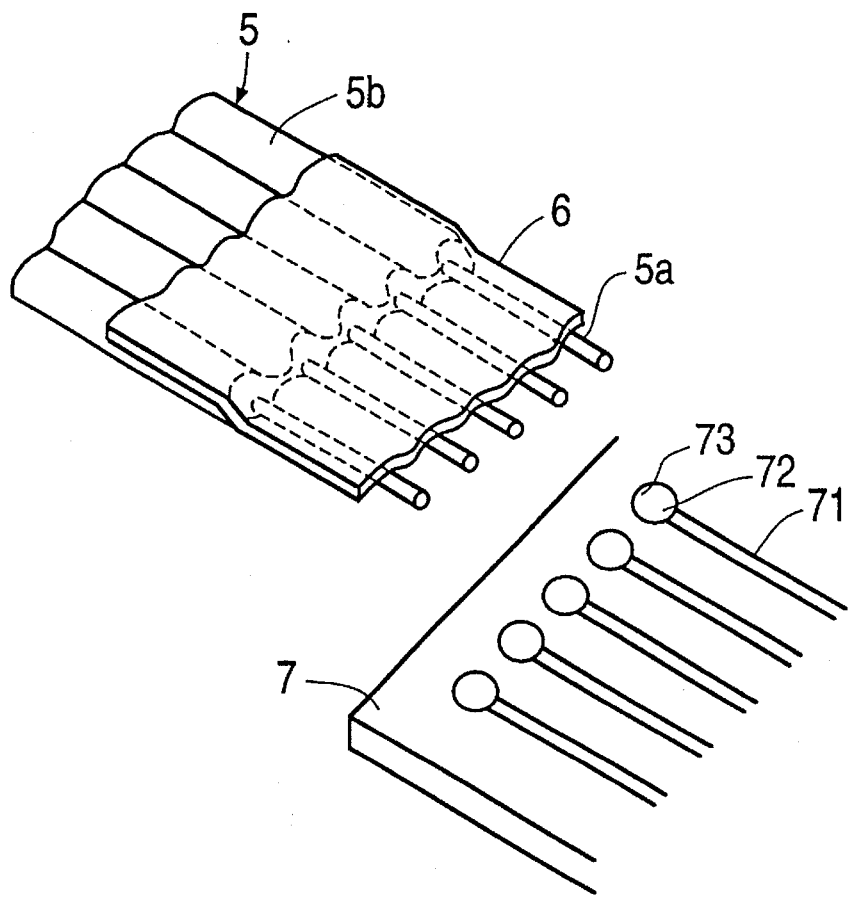
FIG. 3 is a perspective view of a solder connecting portion for illustrating the soldering method according to a second embodiment of the present invention.
Figure 4:
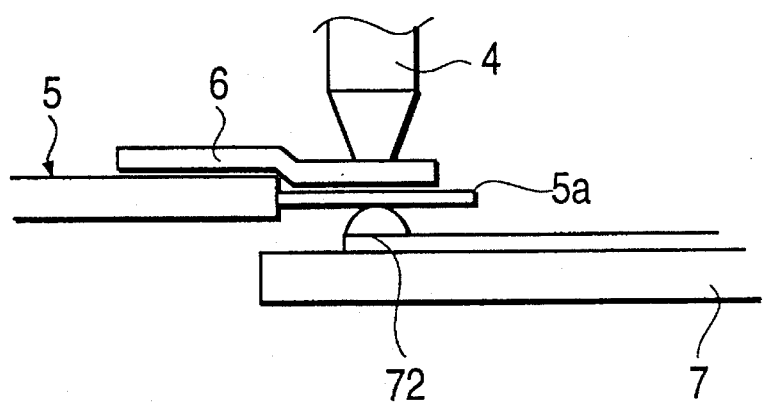
FIG. 4 a front view of the solder connecting portion for illustrating a soldering step of the soldering method shown in FIG. 3.

In FIG. 3 showing a second embodiment of the present invention, a heat-resistive adhesive tape 6 is stuck on an end portion of a flat-cable 5. The flat-cable 5 includes a plurality of parallel core conductors 5a and an insulating coating 5b insulating the respective core conductors 5a and the heat-resistive adhesive tape 6 is continuously stuck on one surface of the flat-cable 5 from an edge of the insulating coating 5b to the exposed core conductors 5a. Materials, heat durability and thickness of the heat-resistive adhesive tape 6 are the same as those of the heat-resistive adhesive tape 2 in the first embodiment. A circuit board 7 includes solder connecting points 72 on a wiring pattern 71 thereof. Solder bumps 73 are preliminarily formed on the respective solder connecting points 72 and the respective core conductors are soldered to the solder connecting points 72, as shown in FIG. 4, by heating them by a heater tip 4 through the heat-resistive adhesive tape 6. Since the thickness of the heat-resistive adhesive tape 6 is 100 μm or less, the solder bumps 73 can be seen therethrough. Therefore, it is possible to confirm the alignment of the core conductors with the respective solder bumps.

As described above, in each of the embodiments of the present invention, the electric cable is soldered to the electronic circuit board by sticking the heat-resistive adhesive tape on the end portion of the insulating coating and the end portion of the core conductor of the cable and melting solder by contacting the heater tip to the heat-resistive adhesive tape. Therefore, the coating of the electric cable is free from being peeled off due to the heat and the heater tip is free from solder dregs. In addition, since the heat-resistive adhesive tape is not melted during soldering operation, there is no contamination of the electric circuit board.

It should be noted that, although, in the embodiments. polyimide is used as the base heat-resistive material of the heat-resistive adhesive tape, the base material may be any so long as melting point thereof is higher than the heating temperature of the heater tip as well as melting point of the solder.

What is claimed is:

1. A soldering method for soldering an electric cable to a wiring pattern of a circuit board, comprising:

a first step of contacting an exposed top portion of a core conductor of the electric cable, having a heat-resistive adhesive tape stuck on the exposed top portion of the core conductor and an edge of an insulating coating of the electric cable, with a solder connecting point of a wiring pattern; and a second step of soldering the core conductor to the solder connecting point by heating it while contacting a heater tip with the heat-resistive adhesive tape on the core conductor.

2. The soldering method claimed in claim 1, further comprising, before said first step, a step of forming a solder bump on the solder connecting point.

3. The soldering method claimed in claim 2, wherein the heat-resistive adhesive tape is composed of a heat-resistive member and an adhesive attached on one surface of the heat-resistive member, melting point of the heat-resistive member is higher than melting point of the solder as well as heating temperature of the heater tip.

4. The soldering method claimed in claim 3, wherein thickness of the heat-resistive member is 100 μm or less.

5. The soldering method claimed in claim 3, wherein the adhesive is of a thermosetting material whose bonding ability is improved by heat from the heater tip.

6. The soldering method claimed in claim 1, wherein in the second step, the heater tip contacts with the heat-resistive adhesive tape for several seconds.

7. The soldering method claimed in claim 1, wherein the electric cable is a flat-cable including a plurality of core conductors having end portions exposed, and the heat-resistive adhesive tape is stuck on an end portion of the insulating coating and the exposed core conductors.

\* \* \* \* \*